(12) United States Patent
Cho et al.

(10) Patent No.: US 12,477,909 B2
(45) Date of Patent: Nov. 18, 2025

(54) DISPLAY APPARATUS

(71) Applicant: Samsung Display Co., Ltd., Yongin-Si (KR)

(72) Inventors: Seunghwan Cho, Yongin-si (KR); Wonsuk Choi, Yongin-si (KR); Jiryun Park, Yongin-si (KR); Kiho Bang, Yongin-si (KR); Seokje Seong, Yongin-si (KR); Yoonsun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 632 days.

(21) Appl. No.: 17/863,913

(22) Filed: Jul. 13, 2022

(65) Prior Publication Data

US 2023/0060062 A1    Feb. 23, 2023

(30) Foreign Application Priority Data

Aug. 17, 2021    (KR) .......................... 10-2021-0108175

(51) Int. Cl.
*H10K 59/131*    (2023.01)
*G09G 3/3233*    (2016.01)

(52) U.S. Cl.
CPC ......... *H10K 59/131* (2023.02); *G09G 3/3233* (2013.01); *G09G 2300/0426* (2013.01); *G09G 2300/0819* (2013.01); *G09G 2300/0842* (2013.01); *G09G 2300/0861* (2013.01); *G09G 2320/0223* (2013.01); *G09G 2320/0626* (2013.01); *G09G 2330/021* (2013.01)

(58) Field of Classification Search
CPC .. H10K 59/131; G09G 3/3258; G09G 3/3291; G09G 3/3233
See application file for complete search history.

(56) References Cited

U.S. PATENT DOCUMENTS

| | | | |
|---|---|---|---|
| 10,997,919 B2 | 5/2021 | Kim et al. | |
| 11,417,277 B2 | 8/2022 | Cho et al. | |
| 11,482,587 B2 | 10/2022 | Cho et al. | |
| 2006/0044237 A1 | 3/2006 | Lee et al. | |
| 2019/0278145 A1* | 9/2019 | Tanaka | G02F 1/136286 |

(Continued)

FOREIGN PATENT DOCUMENTS

| | | |
|---|---|---|
| KR | 10-0600332 B1 | 7/2006 |
| KR | 10-2020-0078806 A | 7/2020 |
| KR | 10-2168786 B1 | 10/2020 |

(Continued)

*Primary Examiner* — Sardis F Azongha
(74) *Attorney, Agent, or Firm* — Innovation Counsel LLP

(57) ABSTRACT

A display apparatus includes a substrate including a display area and a peripheral area outside the display area, a common voltage supply line arranged in the peripheral area and including a first common voltage input part, a second common voltage input part, and a third common voltage input part between the first and second voltage input parts each arranged in a first edge of the display area, a first common voltage line extending from the third common voltage input part and crossing the display area in a first direction, a first data line extending in the first direction across the display area, a first data input line arranged in the peripheral area, and a first connection line connecting the first data input line to the first data line.

18 Claims, 11 Drawing Sheets

(56) References Cited

U.S. PATENT DOCUMENTS

2020/0335025 A1* 10/2020 Kim .................... G09G 3/20
2021/0083037 A1    3/2021 Kim et al.

FOREIGN PATENT DOCUMENTS

KR    10-2020-0136546 A    12/2020
KR    10-2021-0033580 B1    3/2021
KR    10-2021-0086814 A     7/2021

* cited by examiner

DISPLAY APPARATUS

CROSS-REFERENCE TO RELATED APPLICATION

This application is based on and claims priority under 35 U.S.C. § 119 to Korean Patent Application No. 10-2021-0108175 filed on Aug. 17, 2021 in the Korean Intellectual Property Office, the disclosure of which is incorporated by reference herein in its entirety.

BACKGROUND

1. Field

One or more embodiments relate to a display apparatus.

2. Description of the Related Art

Generally, in a display apparatus such as an organic light-emitting display apparatus, thin-film transistors are arranged in a display area to control brightness and the like of a light-emitting diode. The thin-film transistors are configured to control a corresponding light-emitting diode to emit light having a preset color by using a data signal, a driving voltage, and a common voltage transferred thereto.

A data driving circuit, a driving voltage supply line, a common voltage supply line and the like are arranged in a peripheral area outside a display area to respectively provide a data signal, a driving voltage, a common voltage and the like.

SUMMARY

As a portion of a display area in a display apparatus increases, a peripheral area (e.g., a "dead space" in which light-emitting diodes are not arranged) should be reduced. However, as elements are arranged in the peripheral area, reduction of the peripheral area may adversely affect the quality of light emitted from light-emitting diodes.

One or more embodiments include a display apparatus configured to display high-quality images with reduced dead space area. However, the disclosure is not limited thereto.

Additional aspects will be set forth in part in the description which follows and, in part, will be apparent from the description, or may be learned by practice of the presented embodiments of the disclosure.

According to one or more embodiments, a display apparatus includes a substrate including a display area and a peripheral area outside the display area, a common voltage supply line arranged in the peripheral area and including a first common voltage input part, a second common voltage input part, and a third common voltage input part each arranged in a first edge of the display area, a first common voltage line extending from the third common voltage input part into the display area in a first direction, the third common voltage input part being between the first common voltage input part and the second common voltage input part, a first data line extending in the first direction across the display area and arranged on one side of a virtual line extending in the first direction through the third common voltage input part, a first data input line arranged in the peripheral area, and a first connection line arranged in the display area and connecting the first data input line to the first data line.

The first common voltage line may be electrically connected to a first horizontal common voltage line extending in a second direction crossing the first direction.

The first common voltage line and the first horizontal common voltage line may be arranged on different layers.

The first connection line may include a vertical connector and a horizontal connector, the vertical connector extending in the first direction, and the horizontal connector crossing the vertical connector, wherein one end of the first horizontal common voltage line may be adjacent to a connection region between the vertical connector and the horizontal connector.

The first horizontal common voltage line and the horizontal connector may be arranged on a same layer.

The display apparatus may further include a second common voltage line extending in the first direction from the first common voltage input part, and a third common voltage line arranged between the first common voltage line and the second common voltage line and having a length different from a length of the first common voltage line or a length of the second common voltage line.

The first connection line may include a vertical connector and a horizontal connector, the vertical connector extending in the first direction, and the horizontal connector crossing the vertical connector, and one end of the third common voltage line may be adjacent to the vertical connector.

One end of the third common voltage line may be adjacent to an end of the first horizontal common voltage line.

The display apparatus may further include a second horizontal common voltage line arranged in the display area, arranged far away from the first edge of the display area, and electrically connected to the first common voltage line, wherein a length of the first horizontal common voltage line may be less than a length of the second horizontal common voltage line.

According to one or more embodiments, a display apparatus includes a substrate including a display area and a peripheral area outside the display area, a common voltage supply line arranged in the peripheral area and including a first common voltage input part, a second common voltage input part, and a third common voltage input part each arranged in a first edge of the display area, a first common voltage line extending from the third common voltage input part into the display area in a first direction, the third common voltage input part being between the first common voltage input part and the second common voltage input part, a first horizontal common voltage line and a second horizontal common voltage line extending in a second direction crossing the first direction and electrically connected to the first common voltage line, a first data line extending in the first direction across the display area and arranged on one side of a virtual line extending in the first direction through the third common voltage input part, a first data input line arranged in the peripheral area, and a first connection line arranged in the display area and connecting the first data input line to the first data line.

The first horizontal common voltage line and the second horizontal common voltage line may be each arranged on a layer different from a layer on which the first common voltage line is arranged.

A connection region between the first horizontal common voltage line and the first common voltage line, and a connection region between the second horizontal common voltage line and the first common voltage line may be arranged in the display area.

The first horizontal common voltage line may be relatively adjacent to the first edge of the display area, and the second horizontal common voltage line may be relatively away from the first edge of the display area, wherein a length of the second horizontal common voltage line in the second direction may be greater than a length of the first horizontal common voltage line in the first direction.

The first connection line may include a vertical connector and a horizontal connector, the vertical connector extending in the first direction, and the horizontal connector crossing the vertical connector, wherein one end of the first horizontal common voltage line may be adjacent to a connection region between the vertical connector and the horizontal connector.

The display apparatus may further include a first separated horizontal common voltage line arranged opposite the first horizontal common voltage line with the horizontal connector therebetween.

The first horizontal common voltage line and the horizontal connector may be arranged on a same layer.

The display apparatus may further include a second common voltage line extending in the first direction from the first common voltage input part, and a third common voltage line arranged between the first common voltage line and the second common voltage line and having a length different from a length of the first common voltage line or a length of the second common voltage line.

A length of the third common voltage line may be less than a length of the first common voltage line or a length of the second common voltage line.

The first connection line may include a vertical connector and a horizontal connector, the vertical connector extending in the first direction, and the horizontal connector crossing the vertical connector, wherein one end of the third common voltage line may be adjacent to a connection region between the vertical connector and the horizontal connector.

One end of the third common voltage line and one end of the first horizontal common voltage line may be adjacent to the connection region.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
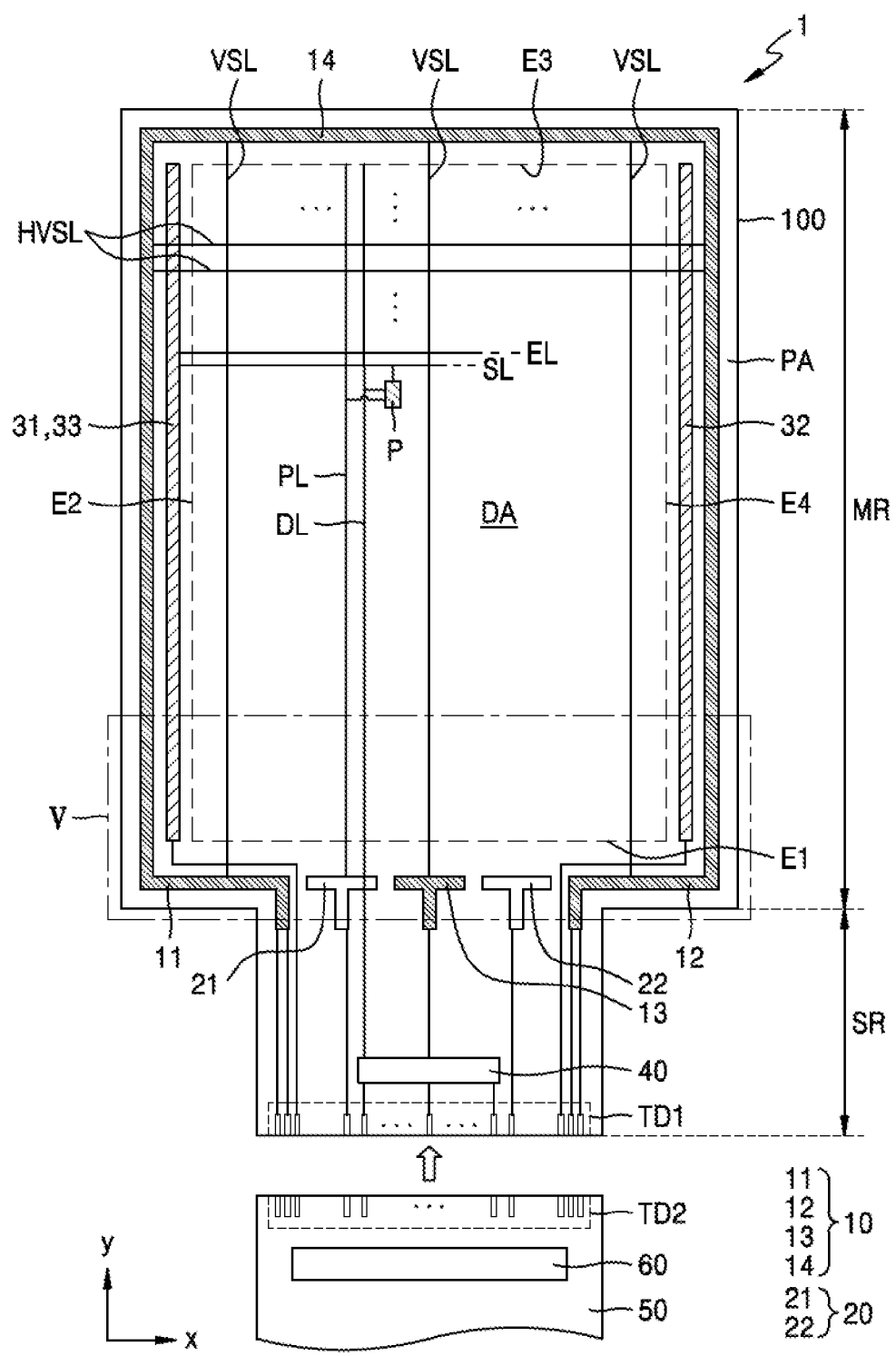
FIG. 1 is a plan view of a portion of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments of the present disclosure are described in detail with reference to the accompanying drawings. When description is made with reference to the drawings, like reference numerals are used for like or corresponding elements and repeated descriptions thereof are omitted.

It will be further understood that, when a layer, region, or component is referred to as being "on" another layer, region, or component, it can be directly or indirectly on the other layer, region, or component. That is, for example, intervening layers, regions, or components may be present. Sizes of elements in the drawings may be exaggerated or reduced for convenience of explanation. For example, since sizes and thicknesses of elements in the drawings are arbitrarily illustrated for convenience of explanation, the disclosure is not limited thereto.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 2:
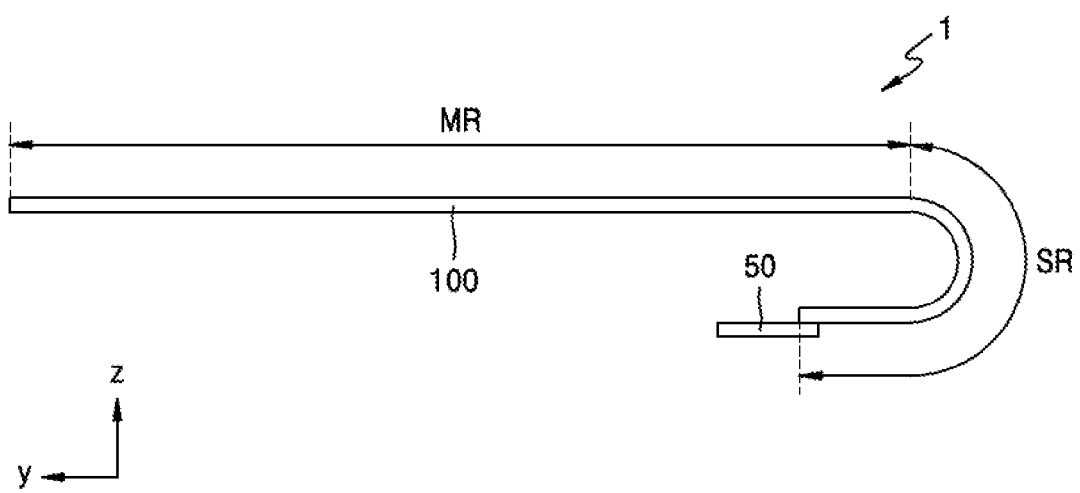
FIG. 2 is a side view of the display apparatus shown in FIG. 1.

FIG. 1 is a plan view of a portion of a display apparatus according to an embodiment, and FIG. 2 is a side view of the display apparatus shown in FIG. 1.

Referring to FIGS. 1 and 2, the display apparatus includes a display panel 1. Any display apparatus may be used as far as it includes the display panel 1 described below. As an example, display apparatuses may be various products such as smartphones, tablet computers, laptop computers, televisions, advertisement boards, and the like.

The display panel 1 may include a display area DA and a peripheral area PA outside the display area DA. The display area DA is a region in which images are displayed. A plurality of pixels P may be arranged in the display area DA. When viewed in a direction approximately perpendicular to the display panel 1, the display area DA may have various shapes, for example, circular shapes, elliptical shapes, polygonal shapes, shapes of specific figures, and the like. Though it is shown in FIG. 1 that the display area DA approximately has a quadrangular shape, the display area DA may approximately have quadrangular shapes having round edges in another embodiment.

The peripheral area PA may be outside the display area DA. The peripheral area PA may surround the display area DA. A portion (referred to as a protruded peripheral area, hereinafter) of the peripheral area PA may extend in a first direction (−y direction) away from the display area DA. In other words, the display panel 1 may include a main region MR and a sub-region SR, the main region MR including the display area DA and a portion of the peripheral area PA surrounding the display area DA, and the sub-region SR extending in one direction from the main area MR. The sub-region SR may correspond to the protruded peripheral area described above. A width (in an x-direction) of the sub-region SR may be less than a width ("width" being in the x-direction) of the main region MR. A portion of the sub-region SR may be bent as shown in FIG. 2. In the case where the display panel 1 is bent as shown in FIG. 2, the peripheral area PA, which is a non-display area, may not be viewed, or even though the peripheral area PA is viewed, a viewed area thereof may be reduced when the display apparatus is viewed.

The shape of the display panel 1 may be substantially the same as the shape of the substrate 100. For example, the substrate 100 may include the display area DA and the peripheral area PA. Alternatively, the substrate 100 may include the main region MR and the sub-region SR. Hereinafter, for convenience of description, description is made to the case where the display area DA and the peripheral area PA are on the substrate 100.

A pixel P may be arranged in the display area DA and may emit red, green, or blue light. As an example, the pixel P may emit light having a preset color by using a light-emitting diode that emits light. A light-emitting diode may be an organic light-emitting diode, an inorganic light-emitting diode, or a quantum-dot light-emitting diode. Hereinafter, for convenience of description, the case where a light-emitting diode is an organic light-emitting diode is described.

A light-emitting diode may be connected to transistors each connected to a signal line or a voltage line configured to control on/off, brightness, and the like of the light-emitting diode. With regard to this, FIG. 1 shows, as signal lines connected to the transistors, a scan line SL, an emission control line EL, and a data line DL, and shows, as voltage lines, a driving voltage line PL and a common voltage line VSL. A common voltage supply line 10, a driving voltage supply line 20, first and second scan driving circuits 31 and 32, an emission control driving circuit 33, and a data driving circuit 40 may be arranged in the peripheral area PA.

The common voltage supply line 10 may be arranged in the peripheral area PA. The common voltage supply line 10 may include a first common voltage input part 11, a second common voltage input part 12, and a third common voltage input part 13 each adjacent to a first edge E1 of the display area DA. The first common voltage input part 11 may be apart from the second common voltage input part 12. The third common voltage input part 13 may be arranged between the first common voltage input part 11 and the second common voltage input part 12. The third common voltage input part 13 may be apart from each of the first common voltage input part 11 and the second common voltage input part 12. The first common voltage input part 11 and the second common voltage input part 12 may be respectively arranged on two opposite ends of the first edge E1 of the display area DA, and the third common voltage input part 13 may be arranged on the middle of the first edge E1 of the display area DA.

The first common voltage input part 11 may be connected to the second common voltage input part 12 by a body part 14 extending along a second edge E2, a third edge E3, and a fourth edge E4 of the display area DA. In some embodiments, the body part 14 may have a shape that outlines three adjoining sides of a rectangle. In other words, the first common voltage input part 11, the second common voltage input part 12, and the body part 14 may be formed as one body. Each of the first common voltage input part 11 and the second common voltage input part 12 may have a vertical portion extending in the first direction and a horizontal portion extending in the second direction.

The common voltage supply line 10 may be electrically connected to the common voltage lines VSL passing across the display area DA. Some of the common voltage lines VSL may extend from the first to third common voltage input parts 11, 12, and 13 toward the display area DA. One of the common voltage lines VSL may cross the display area DA in a first direction (e.g., a y-direction) to connect the third common voltage input part 13 to a portion of the body part 14 facing the third common voltage input part 13. Another of the common voltage lines VSL may cross the display area DA in the first direction to connect the first common voltage input part 11 to a portion of the body part 14 facing the first common voltage input part 11. Similarly, another common voltage line VSL may cross the display area DA in the first direction to connect the second common voltage input part 12 to a portion of the body part 14 facing the second common voltage input part 12. The common voltage lines VSL extending in the first direction may be electrically connected to a horizontal common voltage line HVSL extending in a second direction (e.g., an x-direction) crossing the first direction.

In the case where the common voltage supply line 10 includes the third common voltage input part 13 arranged between the first and second common voltage input parts 11 and 12, a current density may be reduced and heat generation may be suppressed while a current is applied compared to the case where only the first and second common voltage input parts 11 and 12 are provided.

The driving voltage supply line 20 is arranged in the peripheral area PA and electrically connected to the driving voltage line PL crossing the display area DA in the first direction. In an embodiment, the driving voltage supply line 20 may include first and second driving voltage input lines 21 and 22 respectively arranged on two opposite sides with the third common voltage input part 13 therebetween.

First and second scan driving circuits 31 and 32 may be arranged in the peripheral area PA and electrically connected to the scan line SL. In an embodiment, some of the scan lines SL may be electrically connected to the first scan driving circuit 31, and the others may be electrically connected to the second scan driving circuit 32. The first and second scan driving circuits 31 and 32 may each generate a scan signal, and the generated scan signal may be transferred to a transistor through the scan line SL, the transistor being electrically connected to a light-emitting diode.

An emission control driving circuit 33 may be arranged on the side of the first scan driving circuit 31 and configured to transfer an emission control signal to the transistor through the emission control line EL, the transistor being electrically connected to the light-emitting diode. Though it is shown in FIG. 1 that the emission control driving circuit 33 is arranged on only one side of the display area DA, the emission control driving circuit 33 may be arranged on two opposite sides with the display area DA therebetween like the first scan driving circuit 31 and the second scan driving circuit 32.

A data driving circuit 40 may be arranged in the sub-region SR. The data driving circuit 40 may be configured to transfer a data signal to the transistor through the data line DL, the transistor being electrically connected to the light-emitting diode.

A first terminal part TD1 may be arranged on one side of the substrate 100, for example, one end of the sub-region SR. A printed circuit board 50 may be attached on the first terminal part TD1. The printed circuit board 50 may include a second terminal part TD2 electrically connected to the first terminal part TD1. A controller 60 may be arranged on the printed circuit board 50. Control signals of the controller 60 may be respectively provided to the first and second scan driving circuits 31 and 32, the emission control driving circuit 33, the data driving circuit 40, the driving voltage supply line 20, and the common voltage supply line 10 through the first and second terminal parts TD1 and TD2.

Figure 3:
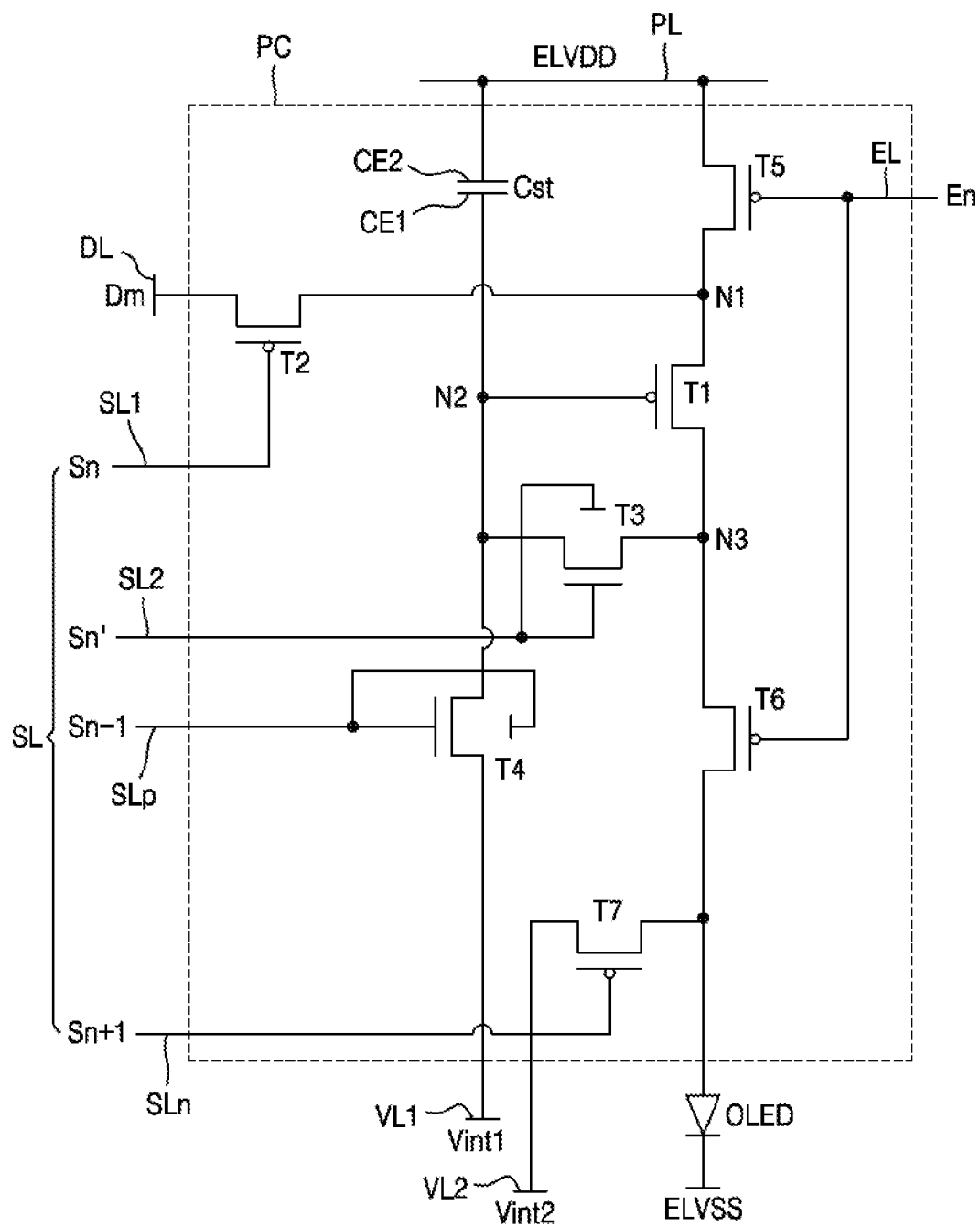
FIG. 3 is an equivalent circuit diagram of a pixel circuit electrically connected to a light-emitting diode corresponding to a pixel of a display apparatus according to an embodiment.

FIG. 3 is an equivalent circuit diagram of a pixel circuit PC electrically connected to a light-emitting diode corresponding to a pixel of a display apparatus according to an embodiment.

As shown in FIG. 3, the pixel circuit PC may include a plurality of thin-film transistors T1, T2, T3, T4, T5, T6, and T7, and a storage capacitor Cst. The plurality of thin-film transistors T1, T2, T3, T4, T5, T6, and T7, and the storage capacitor Cst may be connected to signal lines SL1, SL2, SLp, SLn, EL, and DL, a first initialization voltage line VL1, a second initialization voltage line VL2, and the driving voltage line PL. At least one of the lines, for example, the driving voltage line PL may be shared by pixel circuits PC adjacent to each other.

The plurality of thin-film transistors T1, T2, T3, T4, T5, T6, and T7 may include a driving transistor T1, a switching transistor T2, a compensation transistor T3, a first initialization transistor T4, an operation control transistor T5, an emission control transistor T6, and a second initialization transistor T7.

An organic light-emitting diode OLED may include a first electrode (e.g., a pixel electrode) and a second electrode (e.g., an opposite electrode). The first electrode of the organic light-emitting diode OLED may be connected to the driving transistor T1 through the emission control transistor T6 to receive a driving current, and the second electrode may receive a second power voltage ELVSS. The organic light-emitting diode OLED may generate light having a brightness corresponding to the driving current.

Some of the plurality of thin-film transistors T1, T2, T3, T4, T5, T6, and T7 may be n-channel metal-oxide semiconductor (NMOS) field-effect transistors (n-channel MOSFET), and the rest may be p-channel metal-oxide semiconductor (PMOS) field-effect transistors (p-channel MOSFET). As an example, among the plurality of thin-film transistors T1, T2, T3, T4, T5, T6, and T7, the compensation transistor T3 and the first initialization transistor T4 may be n-channel MOSFET (NMOS), and the rest may be p-channel MOSFET (PMOS). Alternatively, among the plurality of thin-film transistors T1, T2, T3, T4, T5, T6, and T7, the compensation transistor T3, the first initialization transistor T4, and the second initialization transistor T7 may be n-channel MOSFET (NMOS), and the rest may be p-channel MOSFET (PMOS). Alternatively, all of the plurality of thin-film transistors T1, T2, T3, T4, T5, T6, and T7 may be n-channel MOSFET (NMOS) or p-channel MOSFET (PMOS). The plurality of thin-film transistors T1, T2, T3, T4, T5, T6, and T7 may each include amorphous silicon or polycrystalline silicon. When needed, a thin-film transistor, which is an n-channel MOSFET (NMOS), may include an oxide semiconductor. Hereinafter, for convenience of description, the case where the compensation transistor T3 and the first initialization transistor T4 are n-channel MOSFET (NMOS) and the rest are p-channel MOSFET (PMOS) is described.

The signal lines may include a first scan line SL1, a second scan line SL2, a previous scan line SLp, a next scan line SLn, an emission control line EL, and a data line DL, the first scan line SL1 being configured to transfer a first scan signal Sn, the second scan line SL2 being configured to transfer a second scan signal Sn', the previous scan line SLp being configured to transfer a previous scan signal Sn−1 to the first initialization transistor T4, the next scan line SLn being configured to transfer a next scan signal Sn+1 to the second initialization transistor T7, the emission control line EL being configured to transfer an emission control signal En to the operation control transistor T5 and the emission control transistor T6, and the data line DL crossing the first scan line SL1 and being configured to transfer a data signal Dm.

The driving voltage line PL may be configured to transfer the driving voltage ELVDD to the driving transistor T1, the first initialization voltage line VL1 may be configured to transfer a first initialization voltage Vint1 initializing the driving transistor T1, and the second initialization voltage line VL2 may be configured to transfer a second initialization voltage Vint2 initializing the first electrode of the organic light-emitting diode OLED.

A driving gate electrode of the driving transistor T1 may be connected to the storage capacitor Cst through a second node N2, one of a source region and a drain region of the driving transistor T1 may be connected to the driving voltage line PL through the operation control transistor T5 via the first node N1, and the other of the source region and the drain region of the driving transistor T1 may be connected to the first electrode (the pixel electrode) of the organic light-emitting diode OLED through the emission control transistor T6 via a third node N3. The driving transistor T1 may be configured to receive a data signal Dm and supply the driving current to the organic light-emitting diode OLED according to a switching operation of the switching transistor T2. That is, the driving transistor T1 may be configured to control the amount of current flowing from the first node N1 to the organic light-emitting diode OLED in response to a voltage applied to the second node N2 and changed by a data signal Dm, the first node N1 being electrically connected to the driving voltage line PL.

A switching gate electrode of the switching transistor T2 may be connected to the first scan line SL1 configured to transfer a first scan signal Sn, one of a source region and a drain region of the switching transistor T2 may be connected to the data line DL, and the other of the source region and the drain region of the switching transistor T2 may be connected to the driving transistor T1 through the first node N1 and connected to the driving voltage line PL through the fifth transistor T5. The switching transistor T2 may be configured to transfer a data signal Dm from the data line DL to the first node N1 in response to a voltage applied to the first scan line SL1. That is, the switching transistor T2 may perform a switching operation of being turned on according to a first scan signal Sn transferred through the first scan line SL1 and transferring a data signal Dm to the driving transistor T1 through the first node N1, the data signal Dm being transferred through the data line DL.

A compensation gate electrode of the compensation transistor T3 is connected to the second scan line SL2. One of a source region and a drain region of the compensation transistor T3 may be connected to the first electrode of the organic light-emitting diode OLED through the emission control transistor T6 via the third node N3. The other of the source region and the drain region of the compensation transistor T3 may be connected to a first capacitor electrode CE1 of the storage capacitor Cst and the driving gate electrode of the driving transistor T1 through the second node N2. The compensation transistor T3 may diode-connect the driving transistor T1 by being turned on according to a second scan signal Sn' received through the second scan line SL2.

A first initialization gate electrode of the first initialization transistor T4 may be connected to the previous scan line SLp. One of a source region and a drain region of the first initialization transistor T4 may be connected to the first initialization voltage line VL1. One of the source region and the drain region of the first initialization transistor T4 may be connected to the first capacitor electrode CE1 of the storage capacitor Cst and the driving gate electrode of the driving transistor T1 through the second node N2. The first initialization transistor T4 may be configured to apply the first initialization voltage Vint1 from the first initialization voltage line VL1 to the second node N2 according to a voltage applied to the previous scan line SLp. That is, the first initialization transistor T4 may be turned on according to a previous scan signal Sn−1 received through the previous scan line SLp and may perform an initialization operation of initializing the voltage of the driving gate voltage of the driving transistor T1 by transferring the first initialization voltage Vint1 to the driving gate electrode of the driving transistor T1.

An operation control gate electrode of the operation control transistor T5 may be connected to the emission control line EL, one of a source region and a drain region of the operation control transistor T5 may be connected to the driving voltage line PL, and the other of the source region and the drain region of the operation control transistor T5 may be connected to the driving transistor T1 and the switching transistor T2 through the first node N1.

An emission control gate electrode of the emission control transistor T6 may be connected to the emission control line EL, one of a source region and a drain region of the emission control transistor T6 may be connected to the driving transistor T1 and the compensation transistor T3 through the third node N3, and the other of the source region and the drain region of the emission control transistor T6 may be electrically connected to the first electrode (the pixel electrode) of the organic light-emitting diode OLED.

The operation control transistor T5 and the emission control transistor T6 may be simultaneously turned on according to an emission control signal En transferred through the emission control line EL, the driving voltage ELVDD is transferred to the organic light-emitting diode OLED, and the driving current flows through the organic light-emitting diode OLED.

A second initialization gate electrode of the second initialization transistor T7 may be connected to the next scan line SLn, one of a source region and a drain region of the second initialization transistor T7 may be connected to the first electrode (the pixel electrode) of the organic light-emitting diode OLED, and the other of the source region and the drain region of the second initialization transistor T7 may be electrically connected to the second initialization voltage line VL2 to receive the second initialization voltage Vint2. The second initialization transistor T7 is turned on according to a next scan signal Sn+1 transferred through the next scan line SLn and initializes the first electrode (the pixel electrode) of the organic light-emitting diode OLED. The next scan line SLn may be the same as the first scan line SL1. In this case, the relevant scan line may be configured to transfer the same electric signals with a time difference, and thus, may serve as the first scan line SL1 and the next scan line SLn. That is, the next scan line SLn may be a first scan line of another pixel circuit adjacent to the pixel circuit PC shown in FIG. 3 and electrically connected to the same data line DL.

As shown in FIG. 3, the second initialization transistor T7 may be connected to the first scan line SL1. However, the embodiment is not limited thereto, and the second initialization transistor T7 may be connected to the emission control line EL and driven according to an emission control signal En.

The storage capacitor Cst may include the first capacitor electrode CE1 and a second capacitor electrode CE2. The first capacitor electrode CE1 of the storage capacitor Cst is connected to the driving gate electrode of the driving transistor T1 through the second node N2, and the second capacitor electrode CE2 of the storage capacitor Cst is connected to the driving voltage line PL. The storage capacitor Cst may store charge corresponding to a difference between a voltage of the driving gate electrode of the driving transistor T1 and the driving voltage ELVDD.

Specific operations of the pixel circuit PC and the organic light-emitting diode OLED according to an embodiment are as follows.

For an initialization period, when a previous scan signal Sn−1 is supplied through the previous scan line SLp, the first initialization transistor T4 is turned on according to the previous scan signal Sn−1, and the driving transistor T1 is initialized by the first initialization voltage Vint1 supplied from the first initialization voltage line VL1.

For a data programming period, when a first scan signal Sn and a second scan signal Sn' are respectively supplied through the first scan line SL1 and the second scan line SL2, the switching transistor T2 and the compensation transistor T3 are turned on according to the first scan signal Sn and the second scan signal Sn'. In this case, the driving transistor T1 is diode-connected and forward-biased by the compensation transistor T3 that is turned on. Then, a compensation voltage Dm+Vth (Vth has a (−) value) is applied to the driving gate electrode G1 of the driving transistor T1, the compensation voltage Dm+Vth being a voltage that is reduced by a threshold voltage Vth of the driving transistor T1 from a data signal Dm supplied through the data line DL. The driving voltage ELVDD and the compensation voltage Dm+Vth are respectively applied to two opposite ends of the storage capacitor Cst. Charge corresponding to a voltage difference between the two opposite ends thereof is stored in the storage capacitor Cst.

For an emission period, the operation control transistor T5 and the emission control transistor T6 are turned on according to an emission control signal En supplied through the emission control line EL. The driving current occurs, the driving current corresponding to a voltage difference between a voltage of the driving gate electrode G1 of the driving transistor T1 and the driving voltage ELVDD. The driving current is supplied to the organic light-emitting diode OLED through the emission control transistor T6.

As described above, some of the plurality of thin-film transistors T1, T2, T3, T4, T5, T6, and T7 may include an oxide semiconductor. As an example, the compensation transistor T3 and the first initialization transistor T4 may each include an oxide semiconductor.

Because polycrystalline silicon has high reliability, a current accurately intended may be controlled to flow. Accordingly, the driving transistor T1 directly influencing the brightness of the display apparatus may include a semiconductor layer including polycrystalline silicon having high reliability, and thus, a display apparatus having high resolution may be implemented through this configuration. Because an oxide semiconductor has high carrier mobility and a low leakage current, a voltage drop is not large even when a driving time is long. That is, because, in case of an oxide semiconductor, a color change of an image due to a voltage drop is not large even when a display apparatus is driven at low frequencies, the display apparatus may be driven at low frequencies. Accordingly, because the compensation transistor T3 and the first initialization transistor T4 may each include an oxide semiconductor, a display apparatus that may prevent a leakage current from occurring, and simultaneously, reduce power consumption may be implemented.

The oxide semiconductor is sensitive to light, and thus, a change in the amount of current and the like may occur due to external light. Accordingly, a metal layer may be arranged below the oxide semiconductor to absorb or reflect external light. Accordingly, as shown in FIG. 3, the compensation transistor T3 and the first initialization transistor T4 each including an oxide semiconductor may be respectively arranged above and below the oxide semiconductor layer. That is, when viewed in a direction (a z-axis direction) perpendicular to the upper surface of the substrate 100, a metal layer arranged below the oxide semiconductor may overlap an oxide semiconductor.

Figure 4:
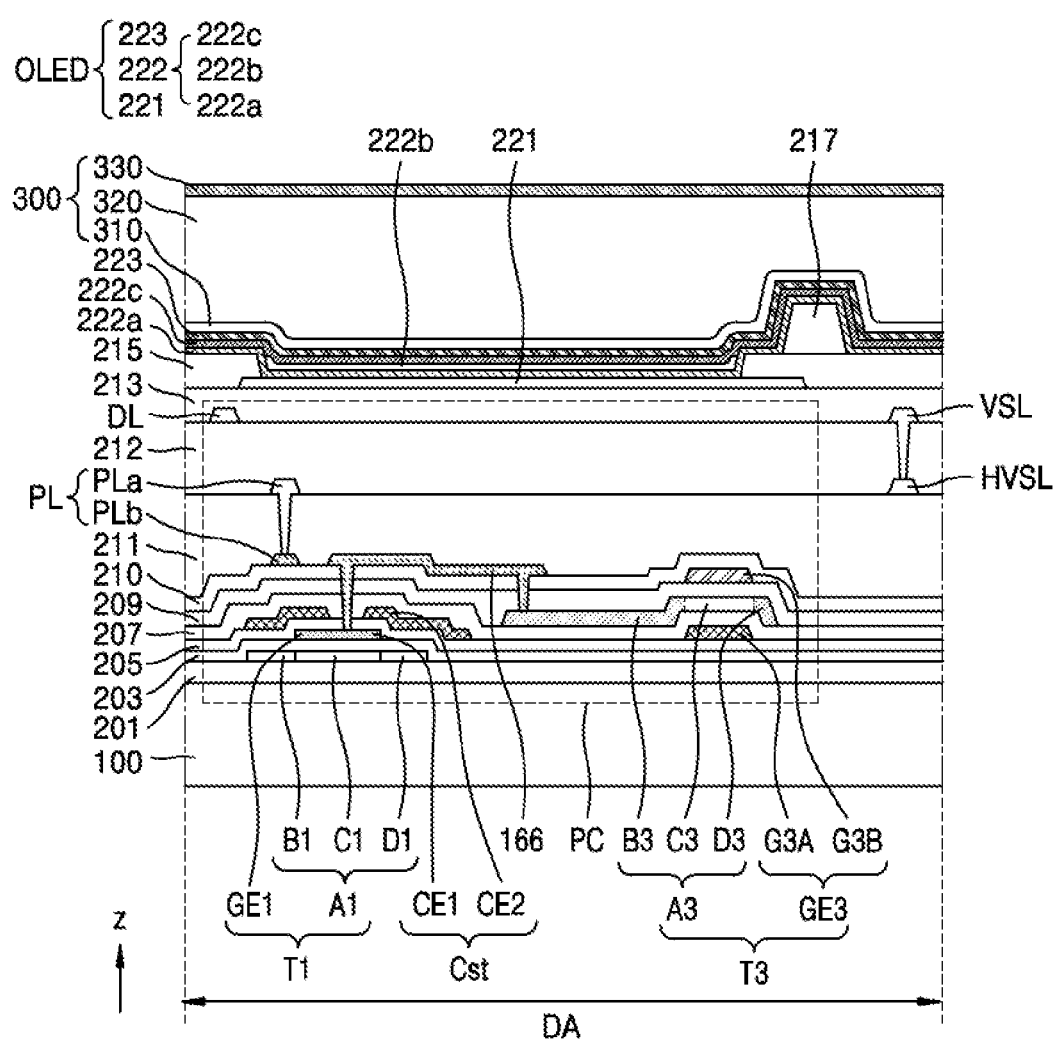
FIG. 4 is a cross-sectional view of a light-emitting diode of a display apparatus and a pixel circuit electrically connected thereto according to an embodiment.

FIG. 4 is a cross-sectional view of a light-emitting diode of the display apparatus and the pixel circuit PC electrically connected thereto according to an embodiment.

Referring to FIG. 4, the organic light-emitting diode OLED is arranged in the display area DA. The organic light-emitting diode OLED may be electrically connected to the pixel circuit PC in a direction (e.g., a z-direction) perpendicular to the substrate 100, the pixel circuit PC being between the substrate 100 and the organic light-emitting diode OLED.

The substrate 100 may include glass or a polymer resin. In an embodiment, the substrate 100 may have a stack structure of a base layer and a barrier layer that are alternately arranged, the base layer including a polymer resin, and the barrier layer including an inorganic insulating material such as silicon oxide or silicon nitride. The polymer resin may include polyethersulfone, polyarylate, polyetherimide, polyethylene naphthalate, polyethylene terephthalate, polyphenylene sulfide, polyimide, polycarbonate, cellulose tri acetate, and cellulose acetate propionate.

Before the pixel circuit PC is formed, a buffer layer 201 may be formed on the substrate 100, the buffer layer 201 preventing impurities from penetrating into the pixel circuit PC. The buffer layer 201 may include an inorganic insulating material such as silicon oxide, silicon oxynitride, and silicon nitride and include a single-layered structure or a multi-layered structure including the above inorganic insulating materials.

As described above with reference to FIG. 3, the pixel circuit PC may include the plurality of transistors and the storage capacitor. With regard to this, FIG. 4 shows the driving transistor T1, the compensation transistor T3, and the storage capacitor Cst.

The driving transistor T1 may include a semiconductor layer A1 (referred to as a driving semiconductor layer) and a driving gate electrode GE1, the driving semiconductor layer A1 being on the buffer layer 210, and the driving gate electrode GE1 overlapping a channel region C1 of the driving semiconductor layer A1. The driving semiconductor layer A1 may include a silicon-based semiconductor material, for example, polycrystalline silicon. The driving semiconductor layer A1 may include the channel region C1, a first region B1, and a second region D1, the first region B1 and the second region D1 being on two opposite sides of the channel region C1. The first region B1 and the second region D1 are regions including a higher concentration than that of the channel region C1. One of the first region B1 and the second region D1 may correspond to a source region, and the other may correspond to a drain region.

A first gate insulating layer 203 may be arranged between the driving semiconductor layer A1 and the driving gate electrode GE1. The first gate insulating layer 203 may include an inorganic insulating material such as silicon oxide, silicon oxynitride, and silicon nitride and include a single-layered structure or a multi-layered structure including the above inorganic insulating materials.

The driving gate electrode GE1 may include a conductive material including molybdenum (Mo), aluminum (Al), copper (Cu), titanium (Ti), and the like and include a single-layered structure or a multi-layered structure including the above materials.

The storage capacitor Cst may include a first capacitor electrode CE1 and a second capacitor electrode CE2 overlapping each other. In an embodiment, the first capacitor electrode CE1 of the storage capacitor Cst may include the driving gate electrode GE1. In other words, the driving gate electrode GE1 may include the first capacitor electrode CE1 of the storage capacitor Cst. As an example, the driving gate electrode GE1 and the first capacitor electrode CE1 of the storage capacitor Cst may be formed as one body.

A first interlayer insulating layer 205 may be arranged between the first capacitor electrode CE1 and the second capacitor electrode CE2 of the storage capacitor Cst. The first interlayer insulating layer 205 may include an inorganic insulating material such as silicon oxide, silicon oxynitride, and silicon nitride and include a single-layered structure or a multi-layered structure including the above inorganic insulating materials.

The second capacitor electrode CE2 of the storage capacitor Cst may include a low-resistance conductive material such as molybdenum (Mo), aluminum (Al), copper (Cu), and/or titanium (Ti) and include a single-layered structure or a multi-layered structure including the above materials.

A second interlayer insulating layer 207 may be arranged on the storage capacitor Cst. The second interlayer insulating layer 207 may include an inorganic insulating material such as silicon oxide, silicon oxynitride, and silicon nitride and include a single-layered structure or a multi-layered structure including the above inorganic insulating materials.

A semiconductor layer A3 (referred to as a compensation semiconductor layer) of the compensation transistor T3 may be arranged on the second interlayer insulating layer 207. The compensation semiconductor layer A3 may include an oxide-based semiconductor material. For example, the compensation semiconductor layer A3 may include Zn-oxide-based material and include, for example, Zn-oxide, In—Zn oxide, Ga—In—Zn oxide, and the like. In an embodiment, the compensation semiconductor layer A3 may include In—Ga—Zn—O (IGZO), In—Sn—Zn—O (ITZO), or In—Ga—Sn—Zn—O (IGTZO) semiconductor containing metal such as indium (In), gallium (Ga), and stannum (Sn) in ZnO.

The compensation semiconductor layer A3 may include a channel region C3, a first region B3, and a second region D3, the first region B3 and the second region D3 being on two opposite sides of the channel region C3. One of the first region B3 and the second region D3 may correspond to a source region, and the other may correspond to a drain region.

The compensation transistor T3 may include a compensation gate electrode GE3 overlapping the channel region C3 of the compensation semiconductor layer A3. The compensation gate electrode GE3 may have a double gate structure including a lower gate electrode G3A and an upper gate electrode G3B, the lower gate electrode G3A being below the compensation semiconductor layer A3, and the upper gate electrode G3B being over the channel region C3.

The lower gate electrode G3A may be arranged on the same layer (e.g., the first interlayer insulating layer 205) as the second capacitor electrode CE2 of the storage capacitor Cst. The lower gate electrode G3A may include the same material as that of the second capacitor electrode CE2 of the storage capacitor Cst.

The upper gate electrode G3B may be arranged over the compensation semiconductor layer A3 with a second gate insulating layer 209 therebetween. The second gate insulating layer 209 may include an inorganic insulating material such as silicon oxide, silicon oxynitride, and silicon nitride and include a single-layered structure or a multi-layered structure including the above inorganic insulating materials.

A third interlayer insulating layer 210 may be arranged on the upper gate electrode G3B. The third interlayer insulating layer 210 may include an inorganic insulating material such as silicon oxynitride and include a single-layered structure or a multi-layered structure including the above inorganic insulating material.

The driving transistor T1 may be electrically connected to the compensation transistor T3 through a node connection line 166. The node connection line 166 may be arranged on the third interlayer insulating layer 210. One side of the node connection line 166 may be connected to the driving gate electrode GE1 of the driving transistor T1, and another side of the node connection line 166 may be connected to the compensation semiconductor layer A3 of the compensation transistor T3.

The node connection line 166 may include aluminum (Al), copper (Cu), and/or titanium (Ti) and include a single-layered structure or a multi-layered structure including the above materials. As an example, the node connection line 166 may have a three-layered structure of a titanium layer/aluminum layer/titanium layer.

A first organic insulating layer 211 may be arranged on the node connection line 166. The first organic insulating layer 211 may include an organic insulating material. An organic insulating material may include acryl, benzocyclobutene (BCB), polyimide, or hexamethyldisiloxane (HMDSO).

The driving voltage line PL may include a first sub-driving voltage line PLa and a second sub-driving voltage line PLb, the first sub-driving voltage line PLa being on the first organic insulating layer 211, and the second sub-driving voltage line PLb being under the first organic insulating layer 211. The first sub-driving voltage line PLa may be connected to the second sub-driving voltage line PLb through a hole passing through the first organic insulating layer 211. In the case where the driving voltage line PL includes a plurality of layers, for example, the first sub-driving voltage line PLa and the second sub-driving voltage line PLb, a voltage drop corresponding to a resistance of the driving voltage line PL may be prevented.

The first sub-driving voltage line PLa and the second sub-driving voltage line PLb may each include aluminum (Al), copper (Cu), and/or titanium (Ti) and include a single-layered structure or a multi-layered structure including the above materials. As an example, the first sub-driving voltage line PLa and the second sub-driving voltage line PLb may each have a three-layered structure of a titanium layer/aluminum layer/titanium layer.

A second organic insulating layer 212 may be arranged on the driving voltage line PL. The second organic insulating layer 212 may include an organic insulating material such as acryl, BCB, polyimide, and/or HMDSO. The data line DL and the common voltage line VSL may be arranged on the second organic insulating layer 212.

The data line DL and the common voltage line VSL may each include aluminum (Al), copper (Cu), and/or titanium (Ti) and include a single-layered structure or a multi-layered structure including the above materials. As an example, the data line DL and the common voltage line VSL may each have a three-layered structure of a titanium layer/aluminum layer/titanium layer.

The data line DL and the common voltage line VSL may be electrically connected to the horizontal common voltage line HVSL on a different layer. As an example, the horizontal common voltage line HVSL may be arranged on the first organic insulating layer 211 and electrically connected to the common voltage line VSL through a hole passing through the second organic insulating layer 212. Because the common voltage line VSL is electrically connected to the horizontal common voltage line HVSL, a voltage drop corresponding to a resistance of the common voltage line VSL may be prevented or reduced.

A third organic insulating layer 213 may be arranged on the data line DL and the common voltage line VSL. The third organic insulating layer 213 may include an organic insulating material such as acryl, BCB, polyimide, and/or HMDSO.

A light-emitting diode, for example, an organic light-emitting diode OLED may be arranged on the third organic insulating layer 213. A first electrode 221 of the organic light-emitting diode OLED may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. In another embodiment, the first electrode 221 may further include a conductive oxide layer on and/or under the reflective layer. The conductive oxide layer may include indium tin oxide (ITO), indium zinc oxide (IZO), zinc oxide (ZnO), indium oxide ($In_2O_3$), indium gallium oxide (IGO), and/or aluminum zinc oxide (AZO). In an embodiment, the first electrode 221 may have a three-layered structure of an ITO layer/Ag layer/ITO layer.

A bank layer 215 may be arranged on the first electrode 221. The bank layer 215 may include an opening that overlaps the first electrode 221 and cover the edges of the first electrode 221. The bank layer 215 may include an organic insulating material.

An intermediate layer 222 may include an emission layer 222b. The intermediate layer 222 may include a first functional layer 222a and/or a second functional layer 222c, the first functional layer 222a being under the emission layer 222b, and the second functional layer 222c being on the emission layer 222b. The emission layer 222b may include a polymer organic material or a low-molecular weight organic material that emits light of a preset color. The second functional layer 222c may include an electron transport layer (ETL) and/or an electron injection layer (EIL). The first functional layer 222a and the second functional layer 222c may each include an organic material.

The second electrode 223 may include a conductive material having a low work function. As an example, the second electrode 223 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. Alternatively, the second electrode 223 may further include a layer on the (semi) transparent layer including the above material, the layer including ITO, IZO, ZnO, or $In_2O_3$.

The emission layer 222b may be formed in the display area DA to overlap the first electrode 221 through the opening of the bank layer 215. In contrast, the first functional layer 222a, the second functional layer 222c, and the second electrode 223 may cover the display area DA entirely.

A spacer 217 may be formed on the bank layer 215. The spacer 217 may be formed together during the same process as a process of forming the bank layer 215 or separately formed during a separate process. In an embodiment, the spacer 217 may include an organic insulating material such as polyimide.

The organic light-emitting diode OLED may be covered by an encapsulation layer 300. The encapsulation layer 300 may include at least one organic encapsulation layer and at least one inorganic encapsulation layer. In an embodiment, it is shown in FIG. 6 that the encapsulation layer 300 includes first and second inorganic encapsulation layers 310 and 330, and an organic encapsulation layer 320.

The first inorganic encapsulation layer 310 and the second inorganic encapsulation layer 330 may each include at least one inorganic material from among aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may each include a single layer or a multi-layer including the above materials. The organic encapsulation layer 320 may include a polymer-based material. The polymer-based material may include an acryl-based resin, an epoxy-based resin, polyimide, and polyethylene. In an embodiment, the organic encapsulation layer 320 may include acrylate.

Figure 5:
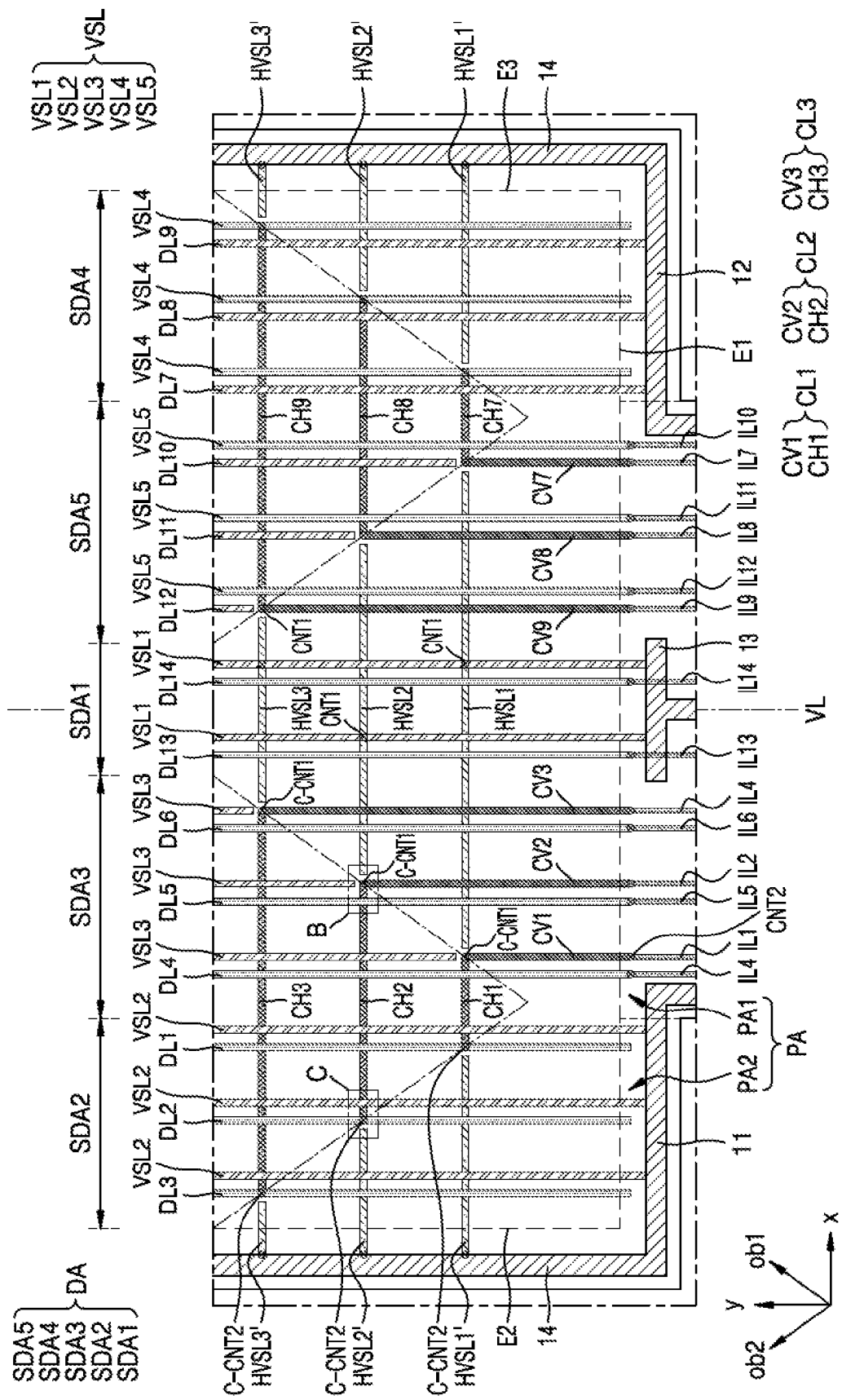
FIG. 5 is a plan view of region V of FIG. 1.
Figure 6:
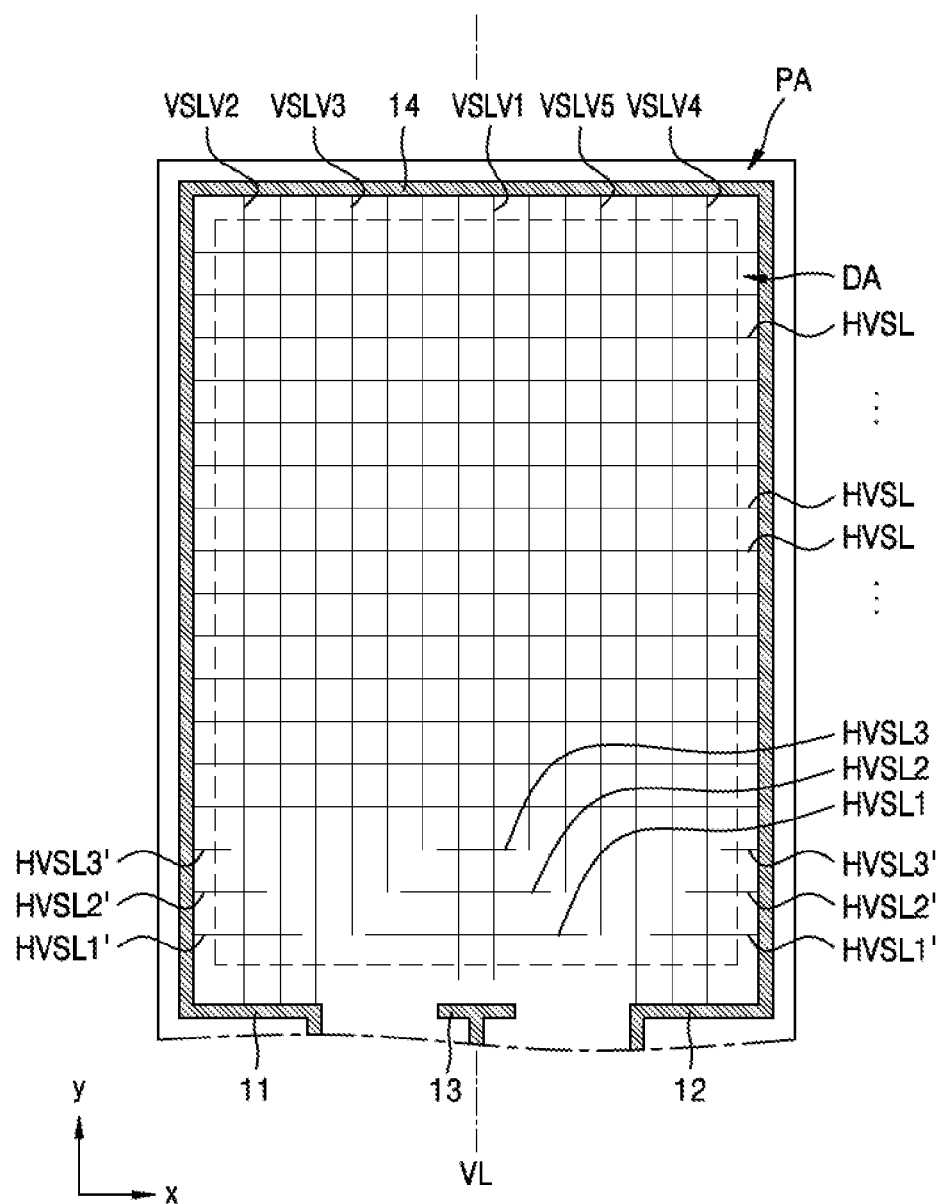
FIG. 6 is a plan view of a display apparatus according to an embodiment and shows common voltage lines.
Figure 7:
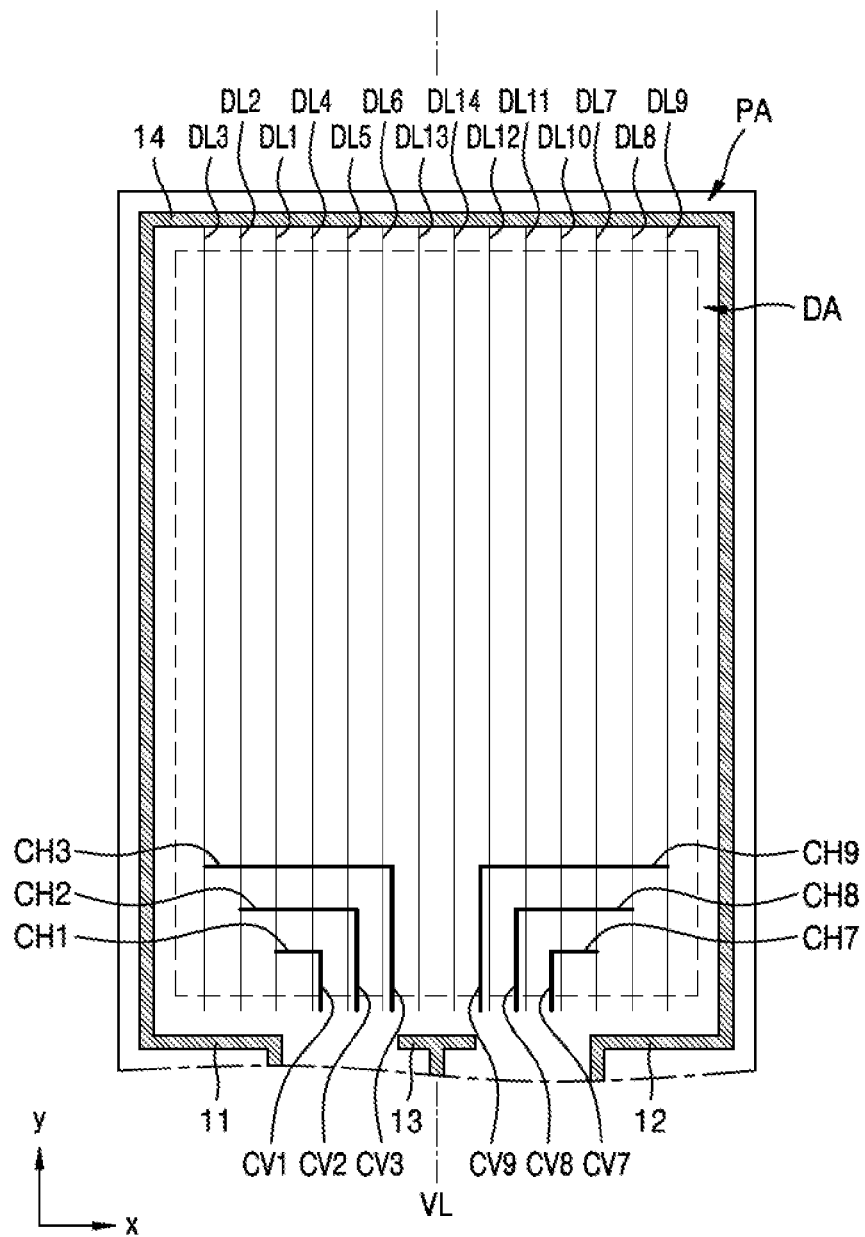
FIG. 7 is a plan view of a display apparatus according to an embodiment and shows data lines and a connection line.

FIG. 5 is a plan view of region V of FIG. 1, FIG. 6 is a plan view of a display apparatus according to an embodiment and shows common voltage lines, and FIG. 7 is a plan view of a display apparatus according to an embodiment and shows data lines and a connection line. Referring to FIG. 5, as described above with reference to FIG. 1, the common voltage supply line 10 may be arranged in the peripheral area PA, and the driving voltage supply lines 20 (see FIG. 1) and the first and second scan driving circuits 31 and 32 and the like described above with reference to FIG. 1 may be provided, but are omitted for convenience of description.

The first common voltage input part 11, the second common voltage input part 12, and the third common voltage input part 13 of the common voltage supply line 10 may be arranged on the same side with respect to the display area DA. With regard to this, it is shown in FIG. 5 that the first common voltage input part 11, the second common voltage input part 12, and the third common voltage input part 13 are adjacent to the first edge E1 of the display area DA. Specific arrangements thereof are the same as that described above with reference to FIG. 1.

Referring to FIGS. 5 and 6, the common voltage lines VSL may be arranged in the display area DA while being extended from the first common voltage input part 11, the second common voltage input part 12, and the third common voltage input part 13. When a common voltage is supplied through the first common voltage input part 11, the second common voltage input part 12, and the third common voltage input part 13, a current density may be reduced and heat generation may be suppressed as described above.

Hereinafter, for convenience of description, among the common voltage lines VSL, a common voltage line electrically connected to the third common voltage input part 13 and extending from the third common voltage input part 13 to cross the display area DA is referred to as a first common voltage line VSL1. A common voltage line electrically connected to the first common voltage input part 11 and extending from the first common voltage input part 11 to cross the display area DA is referred to as a second common voltage line VSL2. A common voltage line arranged between a group of the first common voltage lines VSL1 and a group of the second common voltage lines VSL2 is referred to as a third common voltage line VSL3. In addition, among the common voltage lines VSL, a common voltage line electrically connected to the second common voltage input part 12 and extending from the second common voltage input part 12 to cross the display area DA is referred to as a fourth common voltage line VSL4. A common voltage line arranged between a group of the first common voltage lines VSL1 and a group of the fourth common voltage lines VSL4 is referred to as a fifth common voltage line VSL5.

The display area DA may include a first sub-display area SDA1, a second sub-display area SDA2, a third sub-display area SDA3, a fourth sub-display area SDA4, and a fifth sub-display area SDA5, the first sub-display area SDA1 corresponding to the third common voltage input part 13, the second sub-display area SDA2 corresponding to the first common voltage input part 11, the third sub-display area SDA3 being between the first sub-display area SDA1 and the second sub-display area SDA2, the fourth sub-display area SDA4 corresponding to the second common voltage input part 12, and the fifth sub-display area SDA5 being between the first sub-display area SDA1 and the fourth sub-display area SDA4. The first common voltage lines VSL1 may be arranged in the first sub-display area SDA1, the second common voltage lines VSL2 may be arranged in the second sub-display area SDA2, the third common voltage line VSL3 may be arranged in the third sub-display area SDA3, the fourth sub-display area SDA4 may be arranged in the fourth sub-display area SDA4, and the fifth common voltage line VSL5 may be arranged in the fifth sub-display area SDA5.

To prevent a voltage drop, the common voltage lines VSL extending in the first direction may be electrically connected to horizontal common voltage lines HVSL, HVSL1, HVSL2, HVSL3, HVSL1', HVSL2', and HVSL3' extending in a second direction crossing the first direction as shown in FIGS. 5 and 6.

Referring to FIG. 6, most of the horizontal common voltage lines HVSL arranged relatively away from the first edge E1 of the display area DA may extend to cross the display area DA in the second direction. Most of the horizontal common voltage lines HVSL may be electrically connected to the body part 14 of the common voltage supply line 10. As an example, two opposite ends of each of the horizontal common voltage lines HVSL may be respectively and electrically connected to a portion of the body part 14 adjacent to the second edge E2 of the display area DA and a portion of the body part 14 adjacent to the fourth edge E4.

Referring to FIGS. 5 and 6, the horizontal common voltage lines HVSL1, HVSL2, HVSL3, HVSL1', HVSL2', and HVSL3' arranged relatively adjacent to the first edge E1 of the display area DA may each have a shorter length than those of the horizontal common voltage lines HVSL. The horizontal common voltage line (referred to as first to third horizontal common voltage lines HVSL1, HVSL2, and HVSL3, hereinafter) extending in the second direction to pass across the first sub-display area SDA1 has a shorter length than that of the horizontal common voltage line HVSL.

The first to third horizontal common voltage lines HVSL1, HVSL2, and HVSL3 may be arranged on a layer different from the first common voltage line VSL1 extending in the first direction. As an example, at least one insulating layer (e.g., the second organic insulating layer 212 described above with reference to FIG. 4) may be arranged between the first to third horizontal common voltage lines HVSL1, HVSL2, and HVSL3 and the first common voltage lines VSL1. The first common voltage lines VSL1 may be connected to the first to third horizontal common voltage lines HVSL1, HVSL2, and HVSL3 through a first contact hole CNT1 passing through the at least one insulating layer (e.g., the second organic insulating layer 212) described in the first sub-display area SDA1. The first contact hole CNT1 may be arranged in the display area DA.

Horizontal common voltage lines (referred to as first to third separated horizontal voltage lines HVSL1', HVSL2', and HVSL3') may be arranged in each of the second sub-display area SDA2 and the fourth sub-display area SDA4, the first to third separated horizontal voltage lines HVSL1', HVSL2', and HVSL3' being apart from the first to third horizontal common voltage lines HVSL1, HVSL2, and HVSL3. The first to third separated horizontal voltage lines HVSL1', HVSL2', and HVSL3' may each have a shorter length than that of the horizontal common voltage line HVSL. One end of each of the first to third separated horizontal voltage lines HVSL1', HVSL2', and HVSL3' may extend from the body part 14 toward the display area DA while electrically connected to the body part 14 of the common voltage supply line 10.

Referring to FIGS. 5 to 7, data lines may extend to cross the display area DA in the first direction. As shown in FIG. 5, the data lines crossing the display area DA in the first direction may be connected to data input lines arranged in the peripheral area PA. Hereinafter, for convenience of description, the case where the data lines of FIGS. 5 to 7 include first to fourteenth data lines DL1, DL2, DL3, DL4, DL5, DL6, DL7, DL8, DL9, DL10, DL11, DL12, DL13, and DL14, and the data input lines include first to fourteenth data input lines IL1, IL2, IL3, IL4, IL5, IL6, IL7, IL8, IL9, IL10, IL11, IL12, IL13, and IL14 is described.

Because an area of the peripheral area PA corresponding to a dead region is reduced, the first to fourteenth data input lines IL1, IL2, IL3, IL4, IL5, IL6, IL7, IL8, IL9, IL10, IL11, IL12, IL13, and IL14 may be arranged in a space of a portion of the peripheral area between the first common voltage input part 11 and the second common voltage input part 12. The peripheral area PA may include a first peripheral area PA1 in which the third common voltage input part 13 is arranged, and a second peripheral area PA2, the first peripheral area PA1 being adjacent to a portion of the first edge of the display area DA, the second peripheral area PA2 being the rest of the peripheral area PA excluding the first peripheral area PA1. The first to fourteenth data input lines IL1, IL2, IL3, IL4, IL5, IL6, IL7, IL8, IL9, IL10, IL11, IL12, IL13, and IL14 may be arranged in the first peripheral area PA1.

The first to sixth data lines DL1, DL2, DL3, DL4, DL5, and DL6 may be arranged on the left of a virtual line VL extending in the first direction and passing through the third common voltage input part 13. In one embodiment, the virtual line VL may pass through a center of the third common voltage input part 13 where a portion that extends in the first direction meets the portion that extends in the second direction. The seventh to twelfth data lines DL7, DL8, DL9, DL10, DL11, and DL12 may be arranged on the right of the virtual line VL. As an example, the data lines may include the first to sixth data lines DL1, DL2, DL3, DL4, DL5, and DL6 arranged on the left of the virtual line VL, the seventh to twelfth data lines DL7, DL8, DL9, DL10, DL11, and DL12 arranged on the right, and the thirteenth and fourteenth data lines DL13 and DL14 arranged in the first sub-display area SDA1 therebetween.

The first to third data lines DL1, DL2, and DL3 may be arranged in the second sub-display area SDA2, and the fourth to sixth data lines DL4, DL5, and DL6 may be arranged in the third sub-display area SDA3. The fourth to sixth data lines DL4, DL5, and DL6 may be electrically connected to the fourth to sixth data line lines IL4, IL5, and IL6 therebelow. In contrast, the first to third data lines DL1, DL2, and DL3 may be electrically connected to the first to third data input lines IL1, IL2, and IL3 through first to third connection lines CL1, CL2, and CL3.

The first data line DL1 may be electrically connected to the first data input line IL1 through the first connection line CL1 including a first vertical connector CV1 and a first horizontal connector CH1. The first connection line CL1 may be arranged in the display area DA. As an example, the first vertical connector CV1 of the first connection line CL1 may extend in the first direction in the display area DA, and the first horizontal connector CH1 may extend in the second direction in the display area DA.

The first vertical connector CV1 of the first connection line CL1 may be arranged on the same layer (e.g., the second organic insulating layer 212 described with reference to FIG. 4) as the first data line DL1. The first horizontal connector CH1 of the first connection line CL may be arranged on the same layer (e.g., the first organic insulating layer 211 described with reference to FIG. 4) as the horizontal common voltage line HVSL1.

The first vertical connector CV1 may be arranged on a layer different from the first data input line IL1 and be connected to the first data input line IL1 through a second contact hole CNT2 passing through at least one insulating layer arranged between the first vertical connector CV1 and the first data input line IL1.

The first vertical connector CV1 and the first horizontal connector CH1 may be arranged on different layers. The first vertical connector CV1 may be connected to the first horizontal connector CH1 through a first connection contact hole C-CNT1 passing through at least one insulating layer (e.g., the second organic insulating layer 212 described with reference to FIG. 4) arranged between the first vertical connector CV1 and the first horizontal connector CH1.

The first horizontal connector CH1 may be arranged on a layer different from the first data line DL1. The first horizontal connector CH1 may be connected to the first data line DL1 through a second connection contact hole C-CNT2 passing through at least one insulating layer (e.g., the second organic insulating layer 212 described with reference to FIG. 4) arranged between the first horizontal connector CH1 and the first data line DL1.

The first horizontal connector CH1 may be arranged between the first horizontal common voltage line HVSL1 and the first separated horizontal common voltage line HVSL1'. When a length of each of the first horizontal common voltage line HVSL1 and the first separated horizontal common voltage line HVSL1' is long, a voltage drop due to a self-resistance may be easily prevented. Accordingly, one end of the first horizontal common voltage line HVSL1 may be arranged adjacent to a connection region between the first vertical connector CV1 and the first horizontal connector CH1, for example, the first connection contact hole C-CNT1. Similarly, one end of the first separated horizontal common voltage line HVSL1' may be arranged adjacent to a connection region between the first data line DL1 and the first horizontal connector CH1, for example, the second connection contact hole C-CNT2.

The second data line DL2 may be electrically connected to the second data input line IL2 through the second connection line CL2 including a second vertical connector CV2 and a second horizontal connector CH2. The second vertical connector CV2 and the second horizontal connector CH2 may each be arranged on the same layer as the first vertical connector CV1 and the first horizontal connector CH1 described above and may have the same connection structure as that between the first vertical connector CV1 and the first horizontal connector CH1.

One end of the second vertical connector CV2 of the second connection line CL2 may be connected to the second data input line IL2, and another end may be connected to one end of the second horizontal connector CH2 through the first connection contact hole C-CNT1. Another end of the second horizontal connector CH2 may be connected to the second data line DL2 through the second connection contact hole C-CNT2.

The second horizontal connector CH2 may be arranged between the second horizontal common voltage line HVSL2 and the second separated horizontal common voltage line HVSL2' apart from each other. One end of the second horizontal common voltage line HVSL2 may be arranged adjacent to a connection region between the second vertical connector CV2 and the second horizontal connector CH2, for example, the first connection contact hole C-CNT1. Similarly, one end of the second separated horizontal common voltage line HVSL2' may be arranged adjacent to a connection region between the second data line DL2 and the second horizontal connector CH2, for example, the second connection contact hole C-CNT2.

The third data line DL3 may be electrically connected to the third data input line IL3 through the third connection line CL3 including a third vertical connector CV3 and a third horizontal connector CH3. The third vertical connector CV3 and the third horizontal connector CH3 may each be arranged on the same layer as the first vertical connector CV1 and the first horizontal connector CH1 described above and may have the same connection structure between the first vertical connector CV1 and the first horizontal connector CH1.

One end of the third vertical connector CV3 of the third connection line CL3 may be connected to the third data input line IL3, and another end may be connected to one end of the third horizontal connector CH3 through the first connection contact hole C-CNT1. Another end of the third horizontal connector CH3 may be connected to the third data line DL3 through the second connection contact hole C-CNT2.

The third horizontal connector CH3 may be arranged between the third horizontal common voltage line HVSL3 and the third separated horizontal common voltage line HVSL3' that are apart from each other. One end of the third horizontal common voltage line HVSL3 may be arranged adjacent to a connection region between the third vertical connector CV3 and the third horizontal connector CH3, for example, the first connection contact hole C-CNT1. Similarly, one end of the third separated horizontal common voltage line HVSL3' may be arranged adjacent to a connection region between the third data line DL3 and the third horizontal connector CH3, for example, the second connection contact hole C-CNT2.

The lengths of the first to third horizontal connectors CH1, CH2, and CH3 of the first to third connection lines CL1, CL2, and CL3 may be different from one another, and the lengths of the first to third vertical connectors CV1, CV2, and CV3 of the first to third connection lines CL1, CL2, and CL3 may be different from one another. As an example, the lengths may increase in the order of the first horizontal connector CH1, the second horizontal connector CH2, and the third horizontal connector CH3. The lengths may increase in the order of first vertical connector CV1, the second vertical connector CV2, and the third vertical connector CV3.

The first to third horizontal common voltage lines HVSL1, HVSL2, and HVSL3 and the first to third separated horizontal voltage lines HVSL1', HVSL2', and HVSL3' arranged on the same layer as the first to third horizontal connectors CH1, CH2, and CH3 may have different lengths. The lengths may be reduced in the order of the first to third horizontal common voltage lines HVSL1, HVSL2, and HVSL3. The lengths may be reduced in the order of the first to third separated horizontal voltage lines HVSL1', HVSL2', and HVSL3'.

The first connection contact holes C-CNT1 and the second connection contact holes C-CNT2 may each be arranged in the display area DA and arranged in an oblique direction as shown in FIG. 5. The first connection contact holes C-CNT1 may be arranged in a first oblique direction ob1 forming an acute angle with respect to an x-direction and a y-direction, and the second connection contact holes C-CNT2 may be arranged in a second oblique direction ob2 crossing the first oblique direction ob1 to form V-shape with the first oblique direction ob1.

The common voltage lines extending to be adjacent to the first connection contact holes C-CNT1, for example, the lengths of the third common voltage lines VSL3 may be less than the length of the first common voltage line VSL1 or the second common voltage line VSL2. Because the third common voltage line VSL3 is arranged on the same layer as the first to third vertical connectors CV1, CV2, and CV3, one end of the third common voltage line VSL3 may be arranged adjacent to the first connection contact hole C-CNT1 while being apart from a relevant vertical connector (e.g., the second vertical connector CV2) like region B of FIG. 5. Referring to region B of FIG. 5, one end of the third common voltage line VSL3, one end of the first horizontal common voltage line HVSL1, and the first connection contact hole C-CNT1 may be adjacent to each other. In contrast, because the second common voltage line VSL2 is arranged on a layer different from the first to third horizontal connectors CH1, CH2, and CH3, the second common voltage line VSL2 may extend toward the peripheral area PA while overlapping the horizontal connector (e.g., the second horizontal connector CH2) as shown in region C of FIG. 5.

The structures of the first to sixth data lines DL1, DL2, DL3, DL4, DL5, and DL6, the second and third common voltage lines VSL2 and VSL3 arranged in the neighborhood thereof, the first to third horizontal common voltage lines HVSL1, HVSL2, and HVSL3, and the first to third separated horizontal common voltage lines HVSL1', HVSL2', and HVSL3' are equally applicable to the wirings shown on the right of the first sub-display area SDA1. In other words, the structures of the seventh to ninth vertical connectors CV7 to CV9, the seventh to ninth horizontal connectors CH7, CH8, and CH9, and the neighborhood thereof may be the same as the structures of the first to third vertical connectors CV1, CV2, and CV3, the first to third horizontal connectors CH1, CH2, and CH3, and the neighborhood thereof, the seventh to ninth vertical connectors CV7 to CV9 and the seventh to ninth horizontal connectors CH7, CH8, and CH9 being connected to the seventh to ninth data lines DL7 to DL9 of the fourth sub-display area SDA4, and the first to third vertical connectors CV1, CV2, and CV3, and the first to third horizontal connectors CH1, CH2, and CH3 being connected to the first to third data lines DL1, DL2, and DL3 of the second sub-display area SDA2. In an embodiment, as shown in FIGS. 6 and 7, the first to third vertical connectors CV1, CV2, and CV3 and the seventh to ninth vertical connectors CV7, CV8, and CV9 may be symmetric with the virtual line VL passing through the third common voltage input part 13 and extending in the first direction. Similarly, the first to third horizontal connectors CH1, CH2, and CH3 and the seventh to ninth horizontal connectors CH7, CH8, and CH9 may be also symmetric with respect to the virtual line VL.

Figure 8:
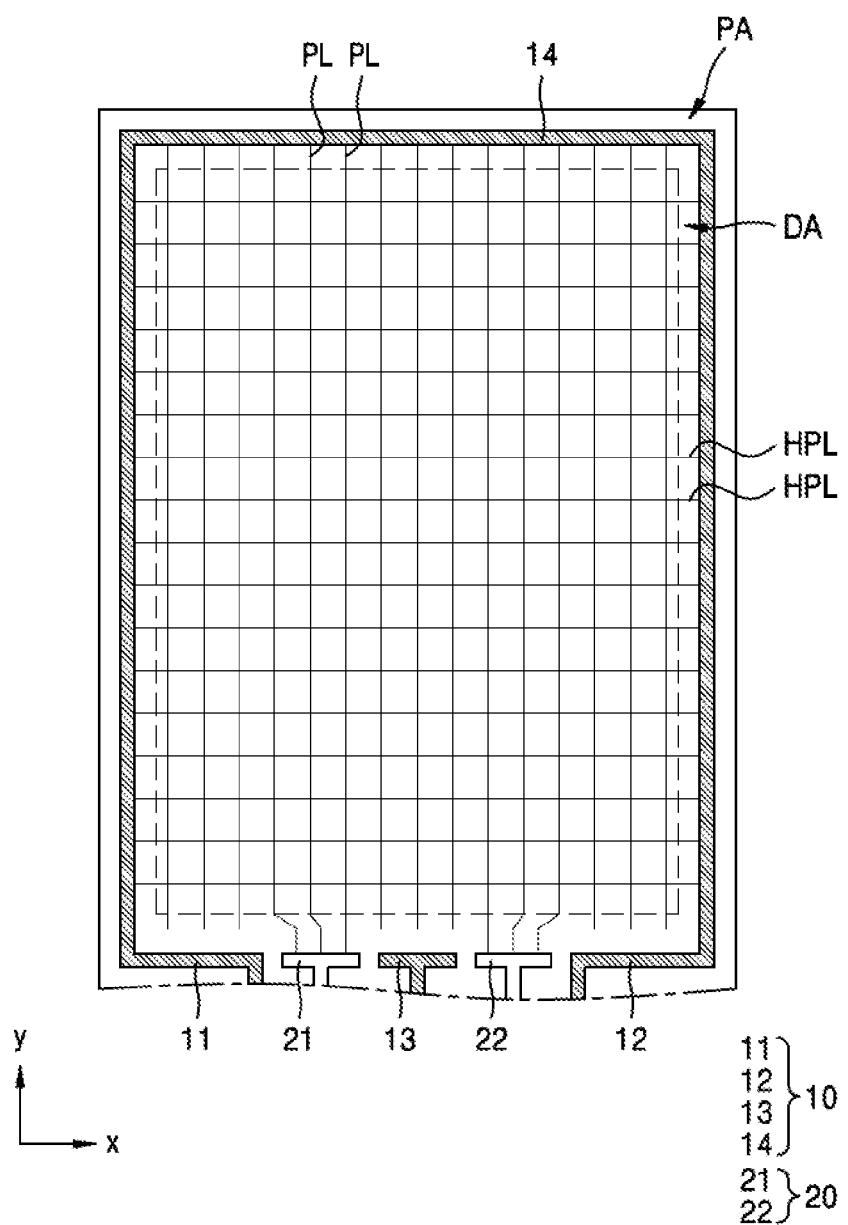
FIG. 8 is a plan view of a display apparatus according to an embodiment and shows driving voltage lines.

FIG. 8 is a plan view of a display apparatus according to an embodiment and shows driving voltage lines.

Referring to FIG. 8, the driving voltage supply line 20 is arranged in the peripheral area PA as described above with reference to FIG. 1. The driving voltage supply line 20 may include the first and second driving voltage input parts 21 and 22 not overlapping the third common voltage input part 13. The first and second driving voltage input parts 21 and 22 may be adjacent to the first edge E1 of the display area DA and apart from each other with the third common voltage input part 13 therebetween.

The driving voltage lines PL and horizontal driving voltage lines HPL may be arranged in the display area DA, the driving voltage lines PL being electrically connected to the driving voltage supply line 20 and extending in the first direction, and the horizontal driving voltage lines HPL extending in the second direction to cross the driving voltage lines PL. The horizontal driving voltage lines HPL may include the second capacitor electrode CE2 (see FIG. 4) described above with reference to FIGS. 3 and 4. In other words, a portion of each of the horizontal driving voltage lines HPL may correspond to the second capacitor electrode CE2 (see FIG. 4).

The driving voltage lines PL and the horizontal driving voltage lines HPL arranged on different layers may be connected to each other in the display area DA. A portion of the driving voltage line PL may be electrically connected to the first and second driving voltage input parts 21 and 22. The connection region of the driving voltage lines PL and the horizontal driving voltage lines HPL may be arranged in the display area DA.

Though it is shown in FIG. 8 that the driving voltage supply line 20 include the first and second driving voltage input parts 21 and 22 apart from each other with the third common voltage input part 13 therebetween, the arrangement of the driving voltage supply line 20 may be variously modified as described below with reference to FIGS. 9 to 11.

Figure 9:
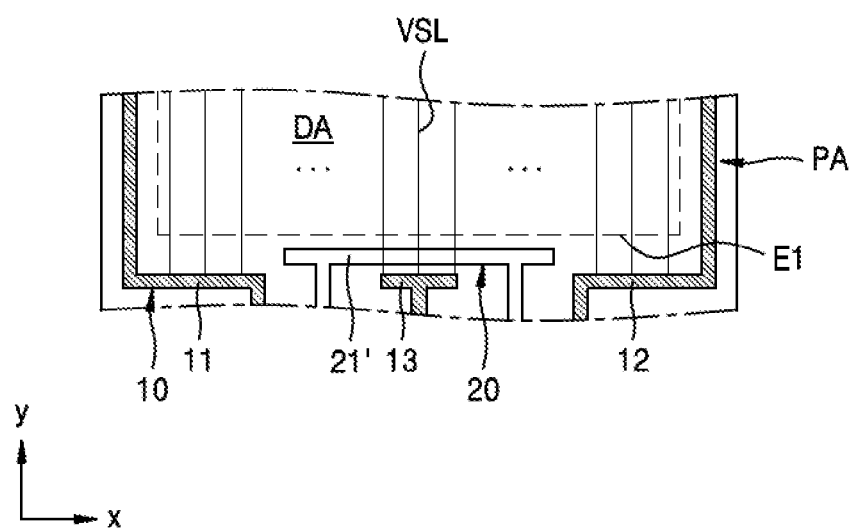
FIGS. 9 to 11 are plan views of a portion of a display apparatus according to an embodiment.
Figure 10:
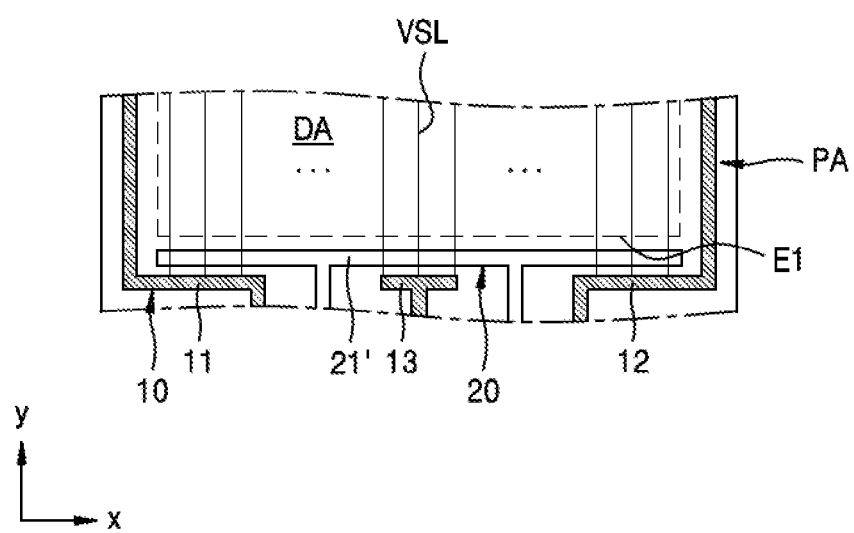
Figure 11:
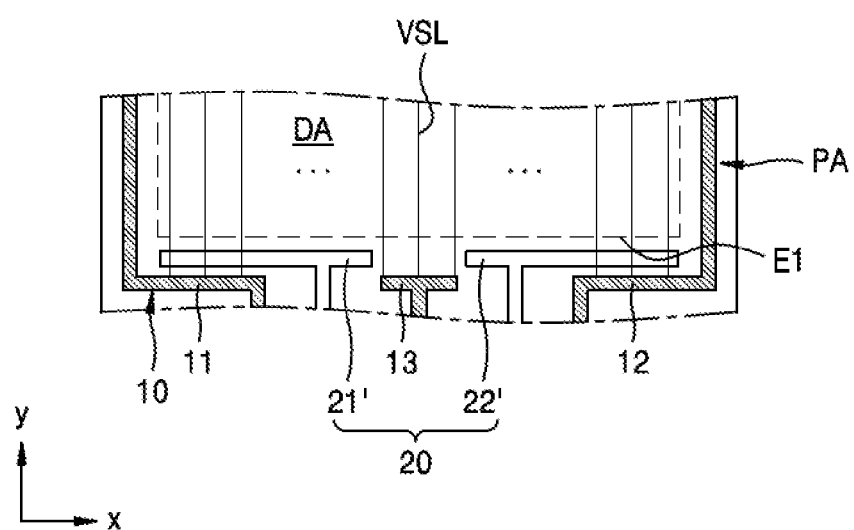

FIGS. 9 to 11 are plan views of a portion of a display apparatus according to an embodiment.

Referring to FIG. 9, the driving voltage supply line 20 may include a driving voltage input part 21' arranged in parallel to the first edge E1 of the display area DA. In this case, a portion of the common voltage line VSL extending from the third common voltage input part 13 may overlap the driving voltage input part 21' in the peripheral area PA.

In FIG. 9, the length of the driving voltage input part 21' may be less than the first edge E1 of the display area DA. There may not be the driving voltage input part 21' in a space between the first common voltage input part 11 and the first edge E1 of the display area DA, and a space between the second common voltage input part 12 and the first edge E1 of the display area DA.

In another embodiment, as shown in FIG. 10, the driving voltage input part 21' may extend in the second direction to exist in a space between the first common voltage input part 11 and the first edge E1 of the display area DA, and a space between the second common voltage input part 12 and the first edge E1 of the display area DA. The length of the driving voltage input part 21' may be substantially the same as or greater than the length of the first edge E1 of the display area DA.

Like that shown in FIG. 9, though it is shown in FIG. 10 that the driving voltage input part 21' overlaps the common voltage line VSL in the peripheral area PA, the driving voltage supply line 20 may include first and second driving voltage input parts 21' and 22' apart from each other in another embodiment as shown in FIG. 11.

The first and second driving voltage input parts 21' and 22' may be arranged to be apart from each other with the third common voltage input part 13 therebetween, a portion of the first driving voltage input part 21' may extend to a space between the first common voltage input part 11 and the first edge E1 of the display area DA, and a portion of the second driving voltage input part 22' may extend to a space between the second common voltage input part 12 and the first edge E1 of the display area DA.

A display apparatus configured to display high-quality images while reducing the area of a dead space may be implemented. However, the scope of the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:
1. A display apparatus comprising:
a substrate including a display area and a peripheral area outside the display area;
a common voltage supply line arranged in the peripheral area and including a first common voltage input part, a second common voltage input part, and a third common voltage input part each arranged in a first edge of the display area;
a first common voltage line extending from the third common voltage input part into the display area in a first direction, the third common voltage input part being between the first common voltage input part and the second common voltage input part, wherein the first common voltage line is electrically connected to a first horizontal common voltage line extending in a second direction crossing the first direction;
a first data line extending in the first direction across the display area and arranged on one side of a virtual line extending in the first direction through the third common voltage input part;

a first data input line arranged in the peripheral area; and
a first connection line arranged in the display area and configured to connect the first data input line to the first data line, wherein the first connection line includes a vertical connector and a horizontal connector, the vertical connector extending in the first direction, and the horizontal connector crossing the vertical connector and wherein one end of the first horizontal common voltage line is adjacent to a connection region between the vertical connector and the horizontal connector.

2. The display apparatus of claim 1, wherein the first common voltage line and the first horizontal common voltage line are arranged on different layers.

3. The display apparatus of claim 1, wherein the first horizontal common voltage line and the horizontal connector are arranged on a same layer.

4. The display apparatus of claim 1, further comprising a second horizontal common voltage line arranged in the display area, arranged far away from the first edge of the display area, and electrically connected to the first common voltage line,
wherein a length of the first horizontal common voltage line is less than a length of the second horizontal common voltage line.

5. A display apparatus comprising:
a substrate including a display area and a peripheral area outside the display area;
a common voltage supply line arranged in the peripheral area and including a first common voltage input part, a second common voltage input part, and a third common voltage input part each arranged in a first edge of the display area;
a first common voltage line extending from the third common voltage input part into the display area in a first direction, the third common voltage input part being between the first common voltage input part and the second common voltage input part, wherein the first common voltage line is electrically connected to a first horizontal common voltage line extending in a second direction crossing the first direction;
a first data line extending in the first direction across the display area and arranged on one side of a virtual line extending in the first direction through the third common voltage input part;
a first data input line arranged in the peripheral area;
a first connection line arranged in the display area and configured to connect the first data input line to the first data line;
a second common voltage line extending in the first direction from the first common voltage input part; and
a third common voltage line arranged between the first common voltage line and the second common voltage line and having a length different from a length of the first common voltage line or a length of the second common voltage line.

6. The display apparatus of claim 5, wherein the first connection line includes a vertical connector and a horizontal connector, the vertical connector extending in the first direction, and the horizontal connector crossing the vertical connector, and
one end of the third common voltage line is adjacent to the vertical connector.

7. The display apparatus of claim 5, wherein one end of the third common voltage line is adjacent to an end of the first horizontal common voltage line.

8. A display apparatus comprising:
a substrate including a display area and a peripheral area outside the display area;
a common voltage supply line arranged in the peripheral area and including a first common voltage input part, a second common voltage input part, and a third common voltage input part each arranged in a first edge of the display area;
a first common voltage line extending from the third common voltage input part into the display area in a first direction, the third common voltage input part being between the first common voltage input part and the second common voltage input part;
a first horizontal common voltage line and a second horizontal common voltage line extending in a second direction crossing the first direction and electrically connected to the first common voltage line;
a first data line extending in the first direction across the display area and arranged on one side of a virtual line extending in the first direction through the third common voltage input part;
a first data input line arranged in the peripheral area; and
a first connection line arranged in the display area and connecting the first data input line to the first data line.

9. The display apparatus of claim 8, wherein the first horizontal common voltage line and the second horizontal common voltage line are each arranged on a layer different from a layer on which the first common voltage line is arranged.

10. The display apparatus of claim 9, wherein a connection region between the first horizontal common voltage line and the first common voltage line and a connection region between the second horizontal common voltage line and the first common voltage line are arranged in the display area.

11. The display apparatus of claim 8, wherein the first horizontal common voltage line is relatively adjacent to the first edge of the display area, and the second horizontal common voltage line is relatively away from the first edge of the display area, and
wherein a length of the second horizontal common voltage line in the second direction is greater than a length of the first horizontal common voltage line in the first direction.

12. The display apparatus of claim 11, wherein the first connection line includes a vertical connector and a horizontal connector, the vertical connector extending in the first direction, and the horizontal connector crossing the vertical connector, and
wherein one end of the first horizontal common voltage line is adjacent to a connection region between the vertical connector and the horizontal connector.

13. The display apparatus of claim 12, further comprising a first separated horizontal common voltage line arranged opposite the first horizontal common voltage line with the horizontal connector therebetween.

14. The display apparatus of claim 12, wherein the first horizontal common voltage line and the horizontal connector are arranged on a same layer.

15. The display apparatus of claim 8, further comprising:
a second common voltage line extending in the first direction from the first common voltage input part; and
a third common voltage line arranged between the first common voltage line and the second common voltage line and having a length different from a length of the first common voltage line or a length of the second common voltage line.

16. The display apparatus of claim 15, wherein a length of the third common voltage line is less than a length of the first common voltage line or a length of the second common voltage line.

17. The display apparatus of claim 15, wherein the first connection line includes a vertical connector and a horizontal connector, the vertical connector extending in the first direction, and the horizontal connector crossing the vertical connector, and wherein one end of the third common voltage line is adjacent to a connection region between the vertical connector and the horizontal connector.

18. The display apparatus of claim 17, wherein one end of the third common voltage line and one end of the first horizontal common voltage line are adjacent to the connection region.

* * * * *